(12) United States Patent
Yoshikawa

(10) Patent No.: US 7,737,002 B2
(45) Date of Patent: Jun. 15, 2010

(54) WAFER DIVIDING METHOD

(75) Inventor: Toshiyuki Yoshikawa, Tokyo (JP)

(73) Assignee: Disco Corporation, Tokyo (JP)

( * ) Notice: Subject to any disclaimer, the term of this patent is extended or adjusted under 35 U.S.C. 154(b) by 98 days.

(21) Appl. No.: 11/806,847

(22) Filed: Jun. 4, 2007

(65) Prior Publication Data
US 2007/0293021 A1 Dec. 20, 2007

(30) Foreign Application Priority Data
Jun. 6, 2006 (JP) .............................. 2006-157211

(51) Int. Cl.
*H01L 21/00* (2006.01)
(52) U.S. Cl. ................. 438/463; 438/460; 438/462; 257/E21.596
(58) Field of Classification Search ............ 438/463, 438/462, 460; 257/E21.596
See application file for complete search history.

(56) References Cited

U.S. PATENT DOCUMENTS

| 6,130,401 | A | 10/2000 | Yoo et al. | |
|---|---|---|---|---|
| 6,514,795 | B1* | 2/2003 | Jiang et al. ................... | 438/113 |
| 6,896,760 | B1* | 5/2005 | Connell et al. ............... | 156/249 |
| 7,388,172 | B2* | 6/2008 | Sercel et al. ........... | 219/121.72 |
| 2004/0180473 | A1* | 9/2004 | Kawai ......................... | 438/114 |
| 2005/0242073 | A1* | 11/2005 | Nakamura et al. ...... | 219/121.72 |
| 2006/0035411 | A1* | 2/2006 | Oba et al. .................... | 438/113 |
| 2006/0205183 | A1* | 9/2006 | Morikazu .................... | 438/463 |
| 2006/0216911 | A1* | 9/2006 | Yoshikawa et al. ........... | 438/460 |
| 2006/0255022 | A1* | 11/2006 | Hoshino et al. ........ | 219/121.69 |
| 2006/0281226 | A1* | 12/2006 | Nakamura et al. .......... | 438/113 |
| 2007/0004179 | A1* | 1/2007 | Nakamura et al. .......... | 438/460 |
| 2007/0109526 | A1* | 5/2007 | Morikazu et al. ............. | 355/78 |
| 2007/0128767 | A1* | 6/2007 | Nakamura ................... | 438/113 |
| 2007/0141811 | A1* | 6/2007 | Sekiya et al. ............... | 438/463 |
| 2007/0264799 | A1* | 11/2007 | Takeda et al. ............... | 438/463 |

FOREIGN PATENT DOCUMENTS

| JP | 06163687 A | * | 6/1994 |
|---|---|---|---|
| JP | 2000-156358 | | 6/2000 |
| JP | 2003163186 A | * | 6/2003 |
| JP | 2003173988 A | * | 6/2003 |
| JP | 2006-051517 | * | 2/2006 |
| JP | 2006093368 A | * | 4/2006 |

* cited by examiner

*Primary Examiner*—Thanh V Pham
*Assistant Examiner*—Duy T Nguyen
(74) *Attorney, Agent, or Firm*—Smith, Gambrell & Russell, LLP

(57) ABSTRACT

A method of dividing a wafer having a plurality of areas defined by the plurality of streets formed in a lattice on the front surface, devices formed in the defined areas and an adhesive film for die bonding on the rear surface and put on a dicing tape affixed to an annular frame along the streets, the method comprising the steps of:

forming a groove along the streets in the wafer by applying a first laser beam whose elliptic focal spot has a ratio of the long axis of the short axis of 15 to 20:1 along the streets formed on the wafer; and dividing the adhesive film along the grooves by applying a second laser beam whose elliptical focal spot has a ratio of the long axis to the short axis of 60 to 70:1 to the adhesive film through the grooves formed by the wafer dividing step.

5 Claims, 13 Drawing Sheets

(a)

(b)

(a)

(b)

(a)

(b)

(c)

(a)

(b)

(c)

WAFER DIVIDING METHOD

FIELD OF THE INVENTION

The present invention relates to a method of dividing a wafer having an adhesive film for die bonding on the rear side.

DESCRIPTION OF THE PRIOR ART

In the production process of a semiconductor device, a plurality of areas are defined by dividing lines called "streets" arranged in a lattice on the front surface of a substantially disk-like silicon substrate, and a device such as IC or LSI is formed in each of the defined areas. Individual semiconductor chips are manufactured by cutting this semiconductor wafer along the streets to divide it into the device formed areas. An optical device wafer comprising photodetectors such as photodiodes or light emitters such as laser diodes formed on the front surface of a sapphire or silicon carbide substrate is also cut along streets to be divided into individual optical devices such as photodiodes or laser diodes which are widely used in electric appliances.

As means of dividing the above semiconductor wafer or optical device wafer along the streets, JP-A 2000-156358 discloses a method in which a groove is formed by applying a pulse laser beam of a wavelength having absorptivity for the wafer along the streets and the wafer is divided along the grooves.

An adhesive film for die bonding called "die attach film" having a thickness of 70 to 80 µm and made of an epoxy resin is bonded to the rear surfaces of the above devices which are then bonded to a die bonding frame for supporting the devices through this adhesive film by heating. To bond the adhesive film for die bonding to the rear surfaces of the devices, after the adhesive film is bonded to the rear surface of the wafer and the wafer is put on a dicing tape through this adhesive film, the adhesive film is cut together with the wafer along the streets formed on the front surface of the wafer to form devices having the adhesive film on the rear surface.

Therefore, when a laser beam is applied along the streets formed on the wafer to cut the adhesive film together with the wafer, the adhesive film is molten and adheres to the dicing tape, thereby making it impossible to pick up the devices from the dicing tape.

SUMMARY OF THE INVENTION

It is an object of the present invention which has been made in view of the above fact to provide a wafer dividing method capable of dividing an adhesive film bonded to a wafer together with the wafer without adhering it to a dicing tape.

To attain the above object, according to the present invention, there is provided a method of dividing a wafer along a plurality of streets by moving the wafer at a predetermined rate while a laser beam whose focal spot is elliptic is applied along the streets formed on the wafer, the wafer having a plurality of areas defined by the plurality of streets formed in a lattice on the front surface, devices formed in the defined areas and an adhesive film for die bonding on the rear surface and put on a dicing tape affixed to an annular frame, the method comprising the steps of:

forming a groove along the streets in the wafer by applying a first laser beam whose elliptic focal spot has a ratio of the long axis of the short axis of 15 to 20:1 along the streets formed on the wafer; and dividing the adhesive film along the grooves by applying a second laser beam whose elliptical focal spot has a ratio of the long axis to the short axis of 60 to 70:1 to the adhesive film through the grooves formed by the wafer dividing step.

The long axis of the elliptic focal spot of the first laser beam is set to 200 µm and the short axis of the elliptic focal spot of the first laser beam is set to 10 µm whereas the long axis of the elliptic focal spot of the second laser beam is set to 650 µm and the short axis of the elliptic focal spot of the second laser beam is set to 10 µm.

The cyclic frequency of the first laser beam is set to 10 kHz, the average output is set to 7 W and the feed rate is set to 300 mm/sec in the wafer dividing step and the cyclic frequency of the second laser beam is set to 10 kHz, the average output is set to 5 W and the feed rate is set to 150 mm/sec in the adhesive film dividing step.

In the present invention, since the ratio of the long axis to the short axis of the elliptic focal spot of the first laser beam applied in the wafer dividing step is set to 15 to 20:1 which is suitable for the formation of a groove in the wafer, the wafer can be divided along the streets without fail. Since the ratio of the long axis to the short axis of the elliptic focal spot of the second laser beam applied in the adhesive film dividing step is set to 60 to 70:1 which is suitable for the division of the adhesive film, the adhesive film can be divided without adhering it to the dicing tape.

DETAILED DESCRIPTION OF THE PREFERRED EMBODIMENTS

Preferred embodiments of the present invention will be described in detail hereinunder with reference to the accompanying drawings.

Figure 1:
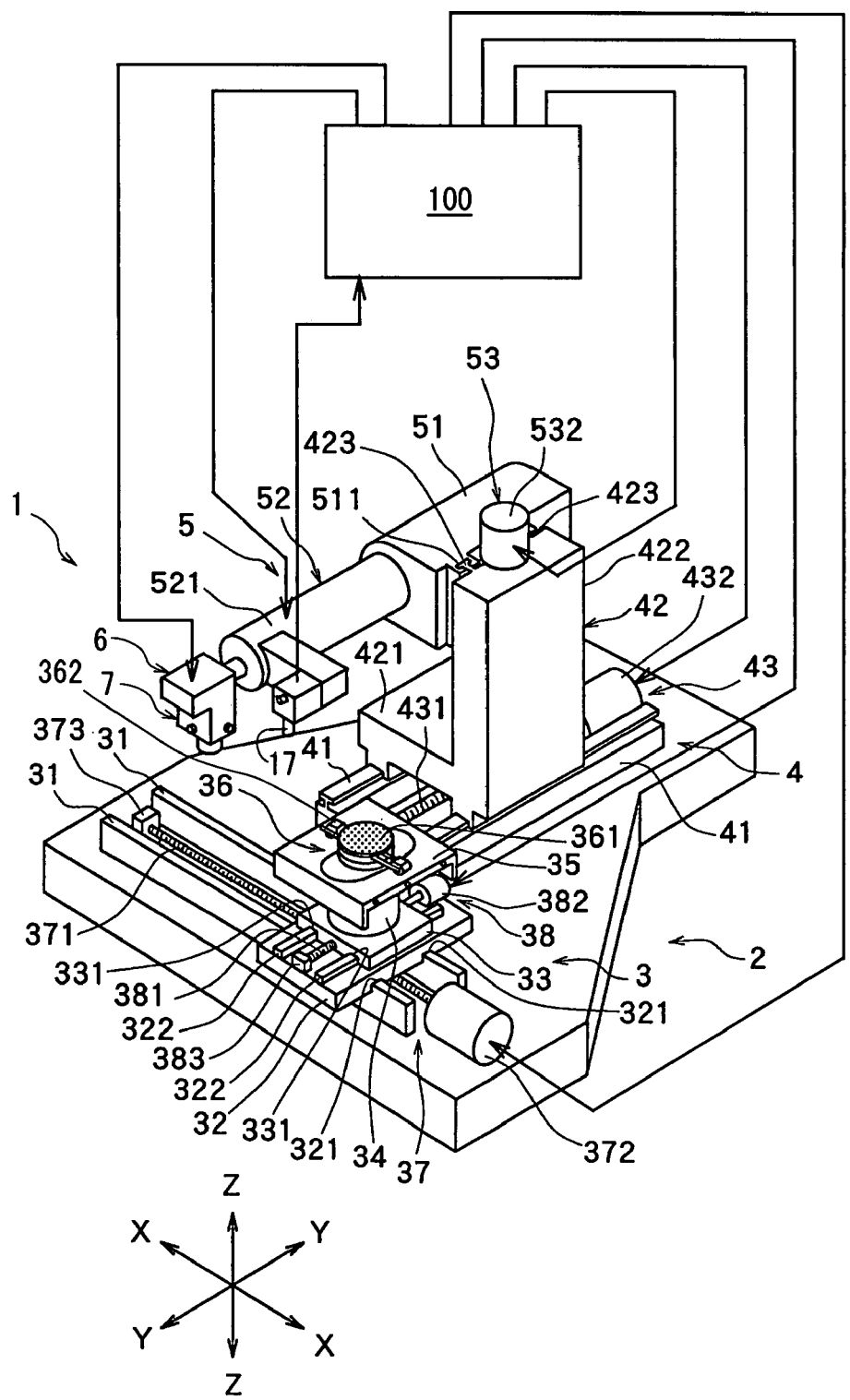
FIG. 1 is a perspective view of a laser beam machine for carrying out the wafer dividing method of the present invention.

FIG. 1 is a perspective view of a laser beam machine for carrying out the wafer dividing method of the present invention. The laser beam machine 1 shown in FIG. 1 comprises a static base 2, a chuck table mechanism 3 for holding a workpiece, which is mounted on the static base 2 in such a manner that it can move in a feed direction shown by an arrow X, a laser beam application unit support mechanism 4 mounted on the static base 2 in such a manner that it can move in an indexing direction shown by an arrow Y perpendicular to the direction shown by the arrow X, and a laser beam application unit 5 mounted to the laser beam application unit support mechanism 4 in such a manner that it can move in a direction shown by an arrow Z.

The above chuck table mechanism 3 comprises a pair of guide rails 31 and 31 mounted on the static base 2 and arranged parallel to each other in the feed direction shown by the arrow X, a first sliding block 32 mounted on the guide rails 31 and 31 in such a manner that it can move in the feed direction shown by the arrow X, a second sliding block 33 mounted on the first sliding block 32 in such a manner that it can move in the indexing direction shown by the arrow Y, a cover table 35 supported on the second sliding block 33 by a cylindrical member 34, and a chuck table 36 as workpiece holding means. This chuck table 36 comprises an adsorption chuck 361 made of a porous material, and a workpiece, for example, a disk-like semiconductor wafer is held on the adsorption chuck 361 by unshown suction means. The chuck table 36 constituted as described above is turned by an unshown pulse motor installed in the cylindrical member 34. The chuck table 36 is provided with clamps 362 for fixing an annular frame which will be described hereinafter.

The above first sliding block 32 has on the under surface a pair of guide grooves 321 and 321 to be mated with the above pair of guide rails 31 and 31 and on the top surface a pair of guide rails 322 and 322 formed parallel to each other in the indexing direction shown by the arrow Y. The first sliding block 32 constituted as described above can move along the pair of guide rails 31 and 31 in the feed direction shown by the arrow X when the guide grooves 321 and 321 are mated with the pair of guide rails 31 and 31, respectively. The chuck table mechanism 3 in the illustrated embodiment comprises feed means 37 for moving the first sliding block 32 along the pair of guide rails 31 and 31 in the feed direction shown by the arrow X. The feed means 37 includes a male screw rod 371 arranged parallel to the above pair of guide rails 31 and 31 and between them and a drive source such as a pulse motor 372 for driving the male screw rod 371. The male screw rod 371 has one end which is rotatably supported to a bearing block 373 fixed on the above static base 2 and the other end which is connected to the output shaft of the above pulse motor 372. The male screw rod 371 is screwed into a threaded through hole formed in an unshown female screw block projecting from the under surface of the center portion of the first sliding block 32. Therefore, by driving the male screw rod 371 in a normal direction or opposite direction with the pulse motor 372, the first sliding block 32 is moved along the guide rails 31 and 31 in the feed direction shown by the arrow X.

The above second sliding block 33 has on the under surface a pair of guide grooves 331 and 331 to be mated with the pair of guide rails 322 and 322 on the top surface of the above first sliding block 32 and can move in the indexing direction shown by the arrow Y when the guide grooves 331 and 331 are mated with the pair of guide rails 322 and 322, respectively. The chuck table mechanism 3 in the illustrated embodiment comprises first indexing means 38 for moving the second sliding block 33 along the pair of guide rails 322 and 322 on the first sliding block 32 in the indexing direction shown by the arrow Y. The first indexing means 38 includes a male screw rod 381 which is arranged parallel to the above pair of guide rails 322 and 322 and between them and a drive source such as a pulse motor 382 for driving the male screw rod 381. The male screw rod 381 has one end which is rotatably supported to a bearing block 383 fixed on the top surface of the above first sliding block 32 and the other end which is connected to the output shaft of the above pulse motor 382. The male screw rod 381 is screwed into a threaded through hole formed in an unshown female screw block projecting from the under surface of the center portion of the second sliding block 33. Therefore, by driving the male screw rod 381 in a normal direction or opposite direction with the pulse motor 382, the second sliding block 33 is moved along the guide rails 322 and 322 in the indexing direction shown by the arrow Y.

The above laser beam application unit support mechanism 4 comprises a pair of guide rails 41 and 41 mounted on the static base 2 and arranged parallel to each other in the indexing direction shown by the arrow Y and a movable support base 42 mounted on the guide rails 41 and 41 in such a manner that it can move in the direction shown by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction shown by the arrow Z on one of its flanks. The laser beam application unit support mechanism 4 in the illustrated embodiment comprises second indexing means 43 for moving the movable support base 42 along the pair of guide rails 41 and 41 in the indexing direction shown by the arrow Y. This second indexing means 43 includes a male screw rod 431 arranged parallel to the above pair of guide rails 41 and 41 and between them and a drive source such as a pulse motor 432 for driving the male screw rod 431. The male screw rod 431 has one end which is rotatably supported to an unshown bearing block fixed on the above static base 2 and the other end which is connected to the output shaft of the above pulse motor 432. The male screw rod 431 is screwed into a threaded through hole formed in an unshown female screw block projecting from the under surface of the center portion of the movable support portion 421 constituting the movable support base 42. Therefore, by driving the male screw rod 431 in a normal direction or opposite direction with the pulse motor 432, the movable support base 42 is moved along the guide rails 41 and 41 in the indexing direction shown by the arrow Y.

The laser beam application unit 5 in the illustrated embodiment comprises a unit holder 51 and laser beam application means 52 secured to the unit holder 51. The unit holder 51 has a pair of guide grooves 511 and 511 to be slidably mated with the pair of guide rails 423 and 423 on the above mounting portion 422 and is supported in such a manner that it can move in the direction shown by the arrow Z when the guide grooves 511 and 511 are mated with the above guide rails 423 and 423, respectively.

The laser beam application unit 5 in the illustrated embodiment comprises moving means 53 for moving the unit holder 51 along the pair of guide rails 423 and 423 in the direction shown by the arrow Z. The moving means 53 includes a male screw rod (not shown) arranged between the above pair of guide rails 423 and 423 and a drive source such as a pulse motor 532 for driving the male screw rod. By driving the unshown male screw rod in a normal direction or opposite direction with the pulse motor 532, the unit holder 51 and the laser beam application means 52 are moved along the guide rails 423 and 423 in the direction shown by the arrow Z. In the illustrated embodiment, the laser beam application means 52 is moved up by driving the pulse motor 532 in the normal direction and moved down by driving the pulse motor 532 in the opposite direction.

Figure 2:
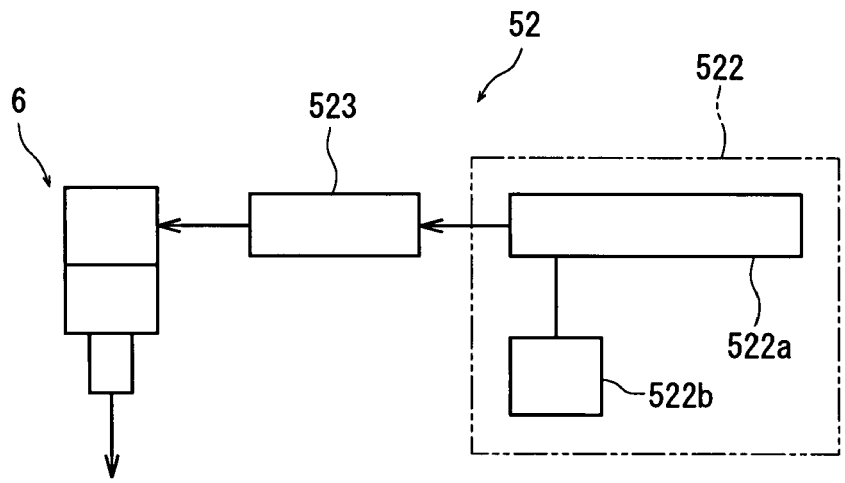
FIG. 2 is a block diagram of laser beam application means provided in the laser beam machine shown in FIG. 1.

The illustrated laser beam application means 52 includes a cylindrical casing 521 secured to the above unit holder 51 and extending substantially horizontally. The laser beam application means 52 comprises pulse laser beam oscillation means 522 and a transmission optical system 523 installed in the casing 521 as shown in FIG. 2 and a processing head 6 for applying a pulse laser beam oscillated by the pulse laser beam oscillation means 522 to the workpiece held on the above chuck table 36, which is attached to the end of the casing 521. The above pulse laser beam oscillation means 522 comprises a pulse laser beam oscillator 522a composed of a YAG laser oscillator or YVO4 laser oscillator and cyclic frequency setting means 522b connected to the pulse laser beam oscillator 522a. The transmission optical system 523 includes a suitable optical element such as a beam splitter.

Figure 3:
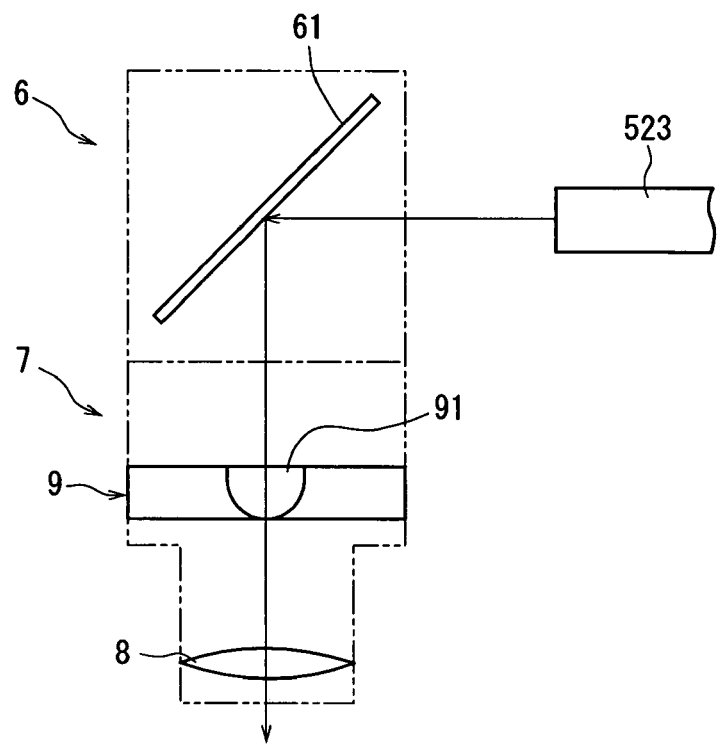
FIG. 3 is a diagram showing a processing head comprising a condenser constituting the laser beam application means shown in FIG. 2.
Figure 4:
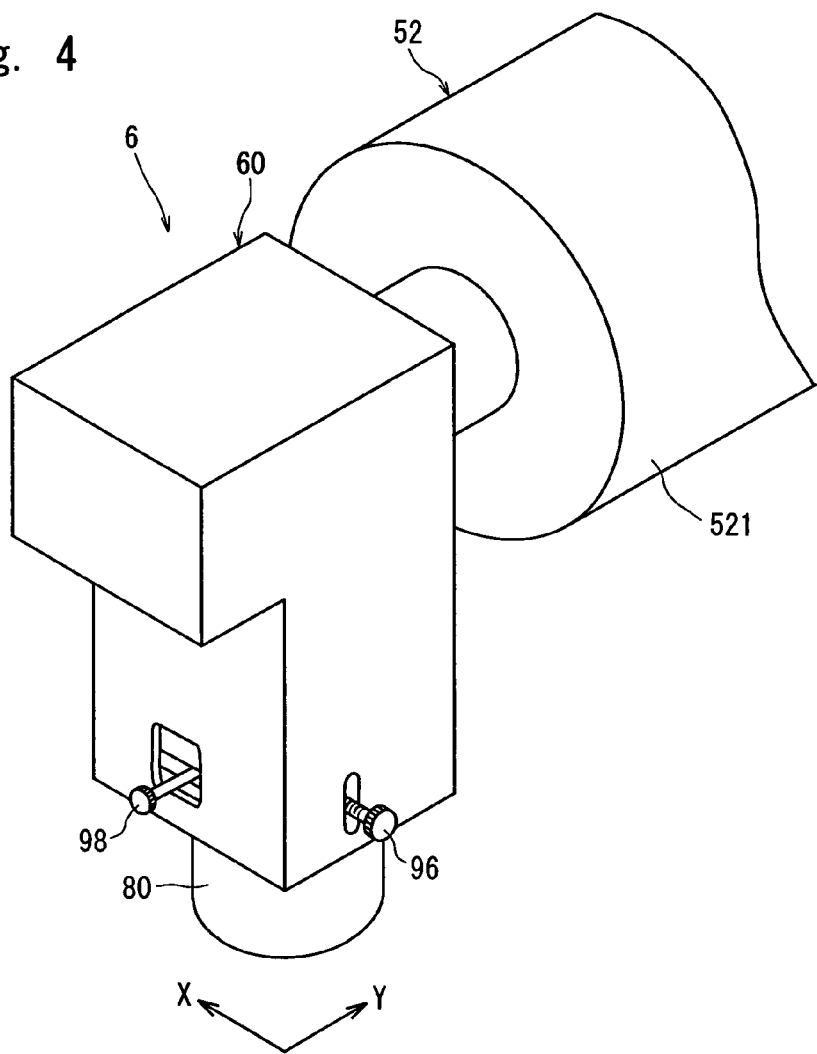
FIG. 4 is a perspective view of the processing head shown in FIG. 3.

The above processing head 6 comprises a direction changing mirror 61 and a condenser 7 as shown in FIG. 3. The direction changing mirror 61 changes the direction of the pulse laser beam oscillated by the above pulse laser beam oscillation means 522 and applied through the transmission optical system 523 toward the condenser 7. The condenser 7 in the illustrated embodiment comprises a condenser lens 8 opposed to the workpiece held on the above chuck table 36, a cylindrical lens unit 9 arranged on the upstream side in the laser beam application direction of the condenser lens 8, that is, between the condenser lens 8 and the direction changing mirror 61, and an interval control mechanism for controlling the interval between the condenser lens 8 and the cylindrical lens unit 9, which will be described hereinafter. The above direction changing mirror 61, the cylindrical lens unit 9 and the interval control mechanism are installed in a processing head housing 60 mounted to the end of the above casing 521 as shown in FIG. 4. The above condenser lens 8 is installed in a lens housing 80 attached to the bottom of the processing head housing 60. The focal distance of the condenser lens 8 is set to 40 mm in the illustrated embodiment.

Figure 5:
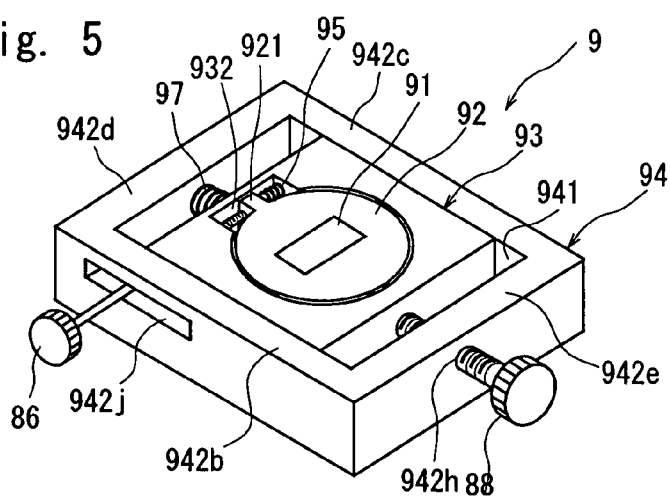
FIG. 5 is a perspective view of a cylindrical lens unit constituting the condenser of the processing head shown in FIG. 3.

A description is subsequently given of the above cylindrical lens unit 9 with reference to FIGS. 5 to 7. FIG. 5 is a perspective view of the cylindrical lens unit 9 and FIG. 6 is an exploded perspective view of the cylindrical lens unit 9 shown in FIG. 5.

Figure 6:
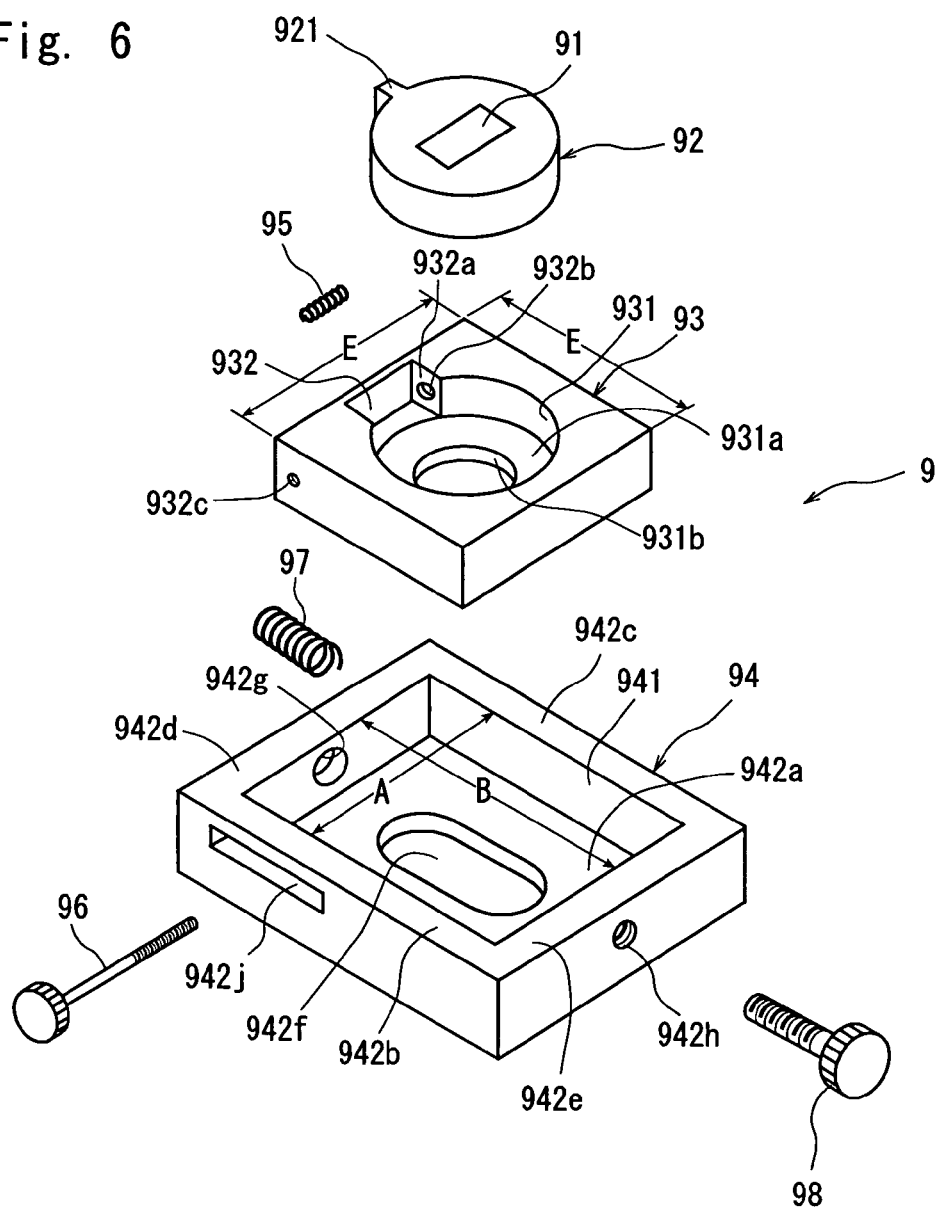
FIG. 6 is an exploded perspective view of the constituent members of the cylindrical lens unit shown in FIG. 5.

The cylindrical lens unit 9 shown in FIG. 5 and FIG. 6 comprises a cylindrical lens 91, a lens holding member 92 for holding the cylindrical lens 91, a first frame 93 for holding the lens holding member 92 and a second frame 94 for holding the first frame 93.

Figure 7:
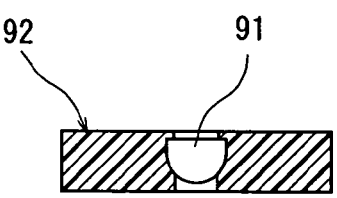
FIG. 7 is a sectional view of a lens holding member holding a cylindrical lens constituting the cylindrical lens unit shown in FIG. 5.

The cylindrical lens 91 is a convex lens having a semicircular section as shown in FIG. 7. The focal distance of this cylindrical lens 91 is set to 40 mm in the illustrated embodiment. The lens holding member 92 for holding the cylindrical lens 91 is circular and made of a synthetic resin in the illustrated embodiment. This cylindrical lens 91 is embedded in the lens holding member 92 made of a synthetic resin in such a manner that its top surface and bottom surface are exposed. A projecting piece 921 is formed from one position of the side wall of the lens holding member 92 as shown in FIG. 6.

The above first frame 93 is square with a side length E, and a circular hollow 931 for accepting the above lens holding member 92 and a working chamber 932 for accepting the projecting piece 921 formed on the lens holding member 92 are formed in the top surface of the first frame 93 as shown in FIG. 6. A hole 931b is formed in the center portion of the bottom wall 931a of the circular hollow 931. A recess 932b which is a spring seat is formed in a wall 932a defining the working chamber 932. A screw hole 932c is formed on the axis of the recess 932b in the first frame 93. The lens holding member 92 is fitted in the circular hollow 931 of the first frame 93 constituted as described above as shown in FIG. 5, and the projecting piece 921 is stored in the working chamber 932. Therefore, the lens holding member 92 fitted in the circular hollow 931 of the first frame 93 can turn along the side wall of the circular hollow 931 as far as the projecting piece 921 can move within the working chamber 932. A compression coil spring 95 is interposed between the above recess 932b and the projecting piece 921. A first control screw 96 is screwed into the above screw hole 932c, and the end of the first control screw 96 is brought into contact with the projecting piece 921. Therefore, when the first control screw 96 is moved forward by turning in one direction, the lens holding member 92 is turned in one direction in defiance of the spring force of the compression coil spring 95, and when the first control screw 96 is moved backward by turning in the other direction, the lens holding member 92 is turned in the other direction by the spring force of the compression coil spring 95. Thus, the projecting piece 921 formed on the lens holding member 92, the first control screw 96 and the compression coil spring 95 function as rotation control means for turning the lens holding member 92 along the side wall of the circular hollow 931.

The above second frame 94 is rectangular, and a rectangular hollow 941 for accepting the first frame 93 is formed in the top surface of the second frame 94 as shown in FIG. 6. This rectangular hollow 941 has a width A corresponding to the side length E of the above square first frame 93 and a length B larger than the side length E of the first frame 93. The rectangular hollow 941 is defined by a bottom wall 942a and side walls 942b, 942c, 942d and 942e. A hole 942f is formed in the center portion of the bottom wall 942a. A recess 942g which is a spring seat is formed in the inner surface of the side wall 942d defining the rectangular hollow 941. A screw hole 942h is formed in the side wall 942e opposite to the side wall 942d having this recess 942g. A prolonged hole 942j for accepting the above first control screw 96 is formed in the side wall 942b of the second frame 94. The above first frame 93 is fitted in the rectangular hollow 941 of the second frame 94 constituted as described above as shown in FIG. 5. A compression coil spring 97 is interposed between the recess 942g formed in the inner surface of the above side wall 942d and the side wall of the first frame 93. A second control screw 98 is screwed into the screw hole 942h formed in the side wall 942e, and the end of the second control screw 98 is brought into contact with the side wall of the first frame 93. Therefore, when the second control screw 98 is moved forward by turning in one direction, the first frame 93 is moved in one direction in defiance of the spring force of the compression coil spring 97 and when the second control screw 98 is moved backward by turning in the other direction, the first frame 93 is moved in the other direction by the spring force of the compression coil spring 97. Thus, the second control screw 98 and the compression coil spring 97 function as moving control means for moving the first frame 93 relative to the second frame 94 in a direction perpendicular to the converging direction of the cylindrical lens 91.

Figure 8:
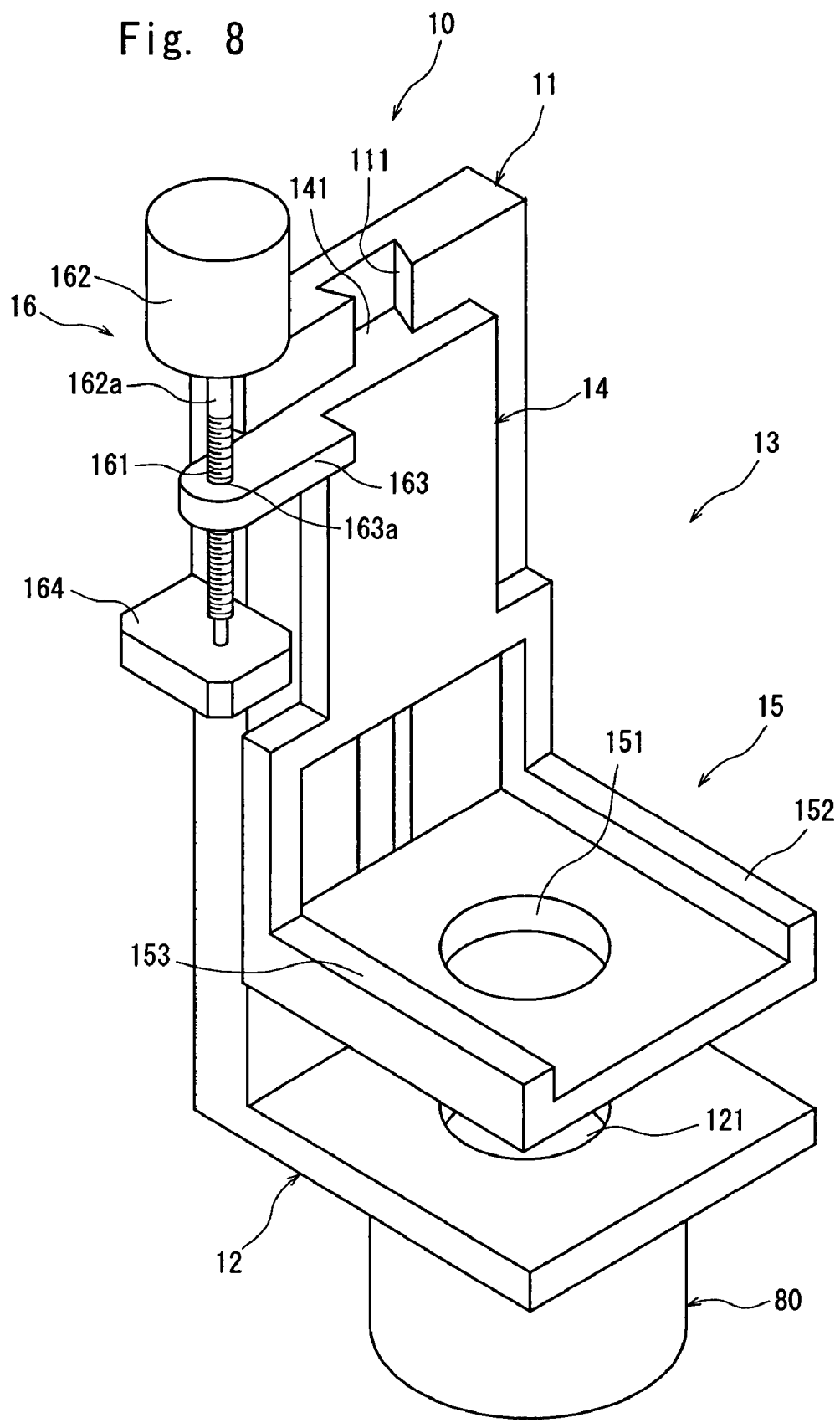
FIG. 8 is a perspective view of an interval control mechanism for controlling the interval between a condenser lens and the cylindrical lens unit provided in the laser beam machine shown in FIG. 1.

The cylindrical lens unit 9 constituted as described above is set in the interval control mechanism 10 shown in FIG. 8. The interval control mechanism 10 will be described hereinbelow.

The interval control mechanism 10 shown in FIG. 8 comprises a support substrate 11, a condenser lens support plate 12 installed at the lower end of the support substrate 11, and a support table 13 arranged such that it can move in the vertical direction along the front surface of the support substrate 11.

A guide groove 111 is formed in the center portion of the front surface of the support substrate 11 in the vertical direction. The condenser lens support plate 12 projects from the front surface of the support substrate 11 at a right angle. A hole 121 is formed in the center portion of this condenser lens support plate 12. The lens housing 80 is mounted to the under surface of the condenser lens support plate 12 constituted as described above in such a manner that the condenser lens 8 is situated at a position corresponding to the hole 121.

The above support table 13 is composed of a support portion 14 and a table portion 15 installed at the lower end of the support portion 14. The support portion 14 has on the back a guide rail 141 to be mated with the guide groove 111 formed in the above support substrate 11. When this guide rail 141 is mated with the guide groove 111, the support table 13 is supported to the support substrate 11 in such a manner that it can move along the guide groove 111 in the vertical direction. The above table portion 15 projects from the front surface of the support portion 14 at a right angle. A hole 151 is formed in the center portion of the table portion 15. Positioning rails 152 and 153 extending at a right angle from the front surface of the support substrate 11 are formed at both side ends of the table portion 15. The interval between the positioning rails 152 and 153 is set to a size corresponding to the width of the second frame 94 constituting the above cylindrical lens unit 9.

The interval control mechanism 10 in the illustrated embodiment comprises moving means 16 for moving down the support table 13 along the guide groove 111 of the support substrate 11. The moving means 16 includes a male screw rod 161 arranged in the vertical direction on one side of the support portion 14 of the support table 13 and a pulse motor 162 for driving the male screw rod 161. The male screw rod 161 is screwed into a threaded screw hole 163a formed in a movable plate 163 fixed to the upper end of the support portion 14, and the lower end of the male screw rod 161 is rotatably journaled to a bearing 164 fixed to the side surface of the support substrate 11. The pulse motor 162 is attached to the support substrate 11, and its drive shaft 162a is connected to the upper end of the male screw rod 161. Therefore, the support table 13 is moved down by driving the male screw rod 161 in the normal direction with the pulse motor 162 and moved up by driving the male screw rod 161 in the opposite direction. Thus, the moving means 16 can suitably control the interval between the table portion 15 of the support table 13 and the condenser lens support plate 12 by driving the pulse motor 162 in the normal direction or opposite direction.

Figure 9:
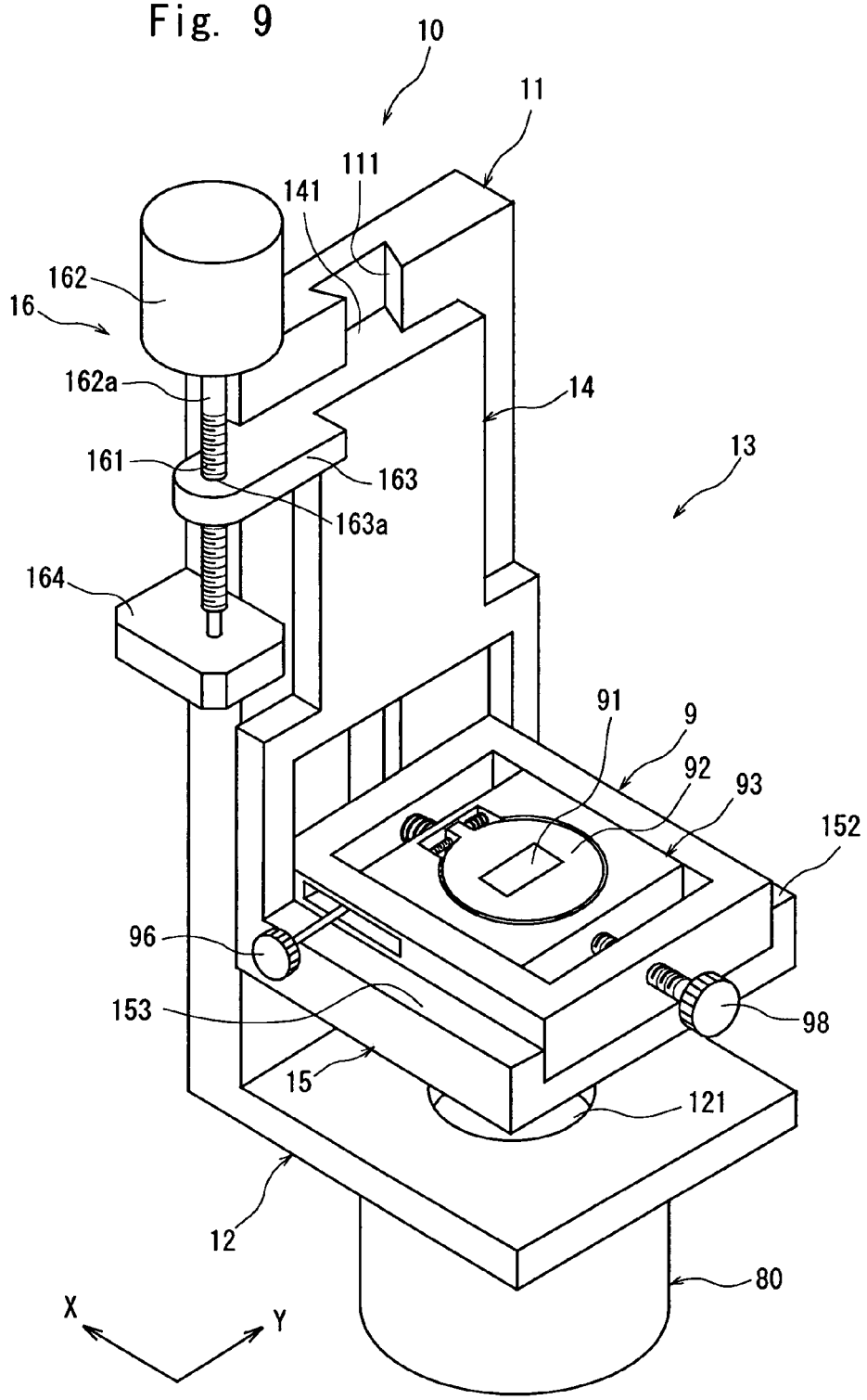
FIG. 9 is a perspective view of the interval control mechanism 8 in which the cylindrical lens unit is set.

The above cylindrical lens unit 9 is placed on the table portion 15 of the support table 13 of the interval control mechanism 10 constituted as described above as shown in FIG. 9. That is, the second frame 94 of the cylindrical lens unit 9 is placed between the positioning rails 152 and 153 of the table portion 15 constituting the support table 13. The cylindrical lens unit 9 placed at a predetermined position on the table portion 15 of the support table 13 is fixed on the table portion 15 of the support table 13 by unshown suitable fixing means. The converging direction of the cylindrical lens 91 of the cylindrical lens unit 9 placed on the table portion 15 of the support table 13 is set to the feed direction shown by the arrow X in FIG. 1.

Returning to FIG. 1, image pick-up means 17 for detecting the area to be processed by the above laser beam application means 52 is mounted to the front end portion of the casing 521 constituting the above laser beam application means 52. This image pick-up means 17 comprises an image pick-up device (CCD) and supplies an image signal to control means 100. This control means 100 is composed of a computer, receives an image signal from the above image pick-up means 17 and supplies controls signals to the above pulse motor 372, pulse motor 382, pulse motor 432, pulse motor 532 and pulse motor 162.

The laser beam machine in the illustrated embodiment is constituted as described above and its function will be described hereinunder.

The shape of the focal spot of a laser beam applied by the above-described laser beam application means 52 will be described with reference to FIGS. 10(a) to 10(c) and FIGS. 11(a) to 11(c).

Figure 10:
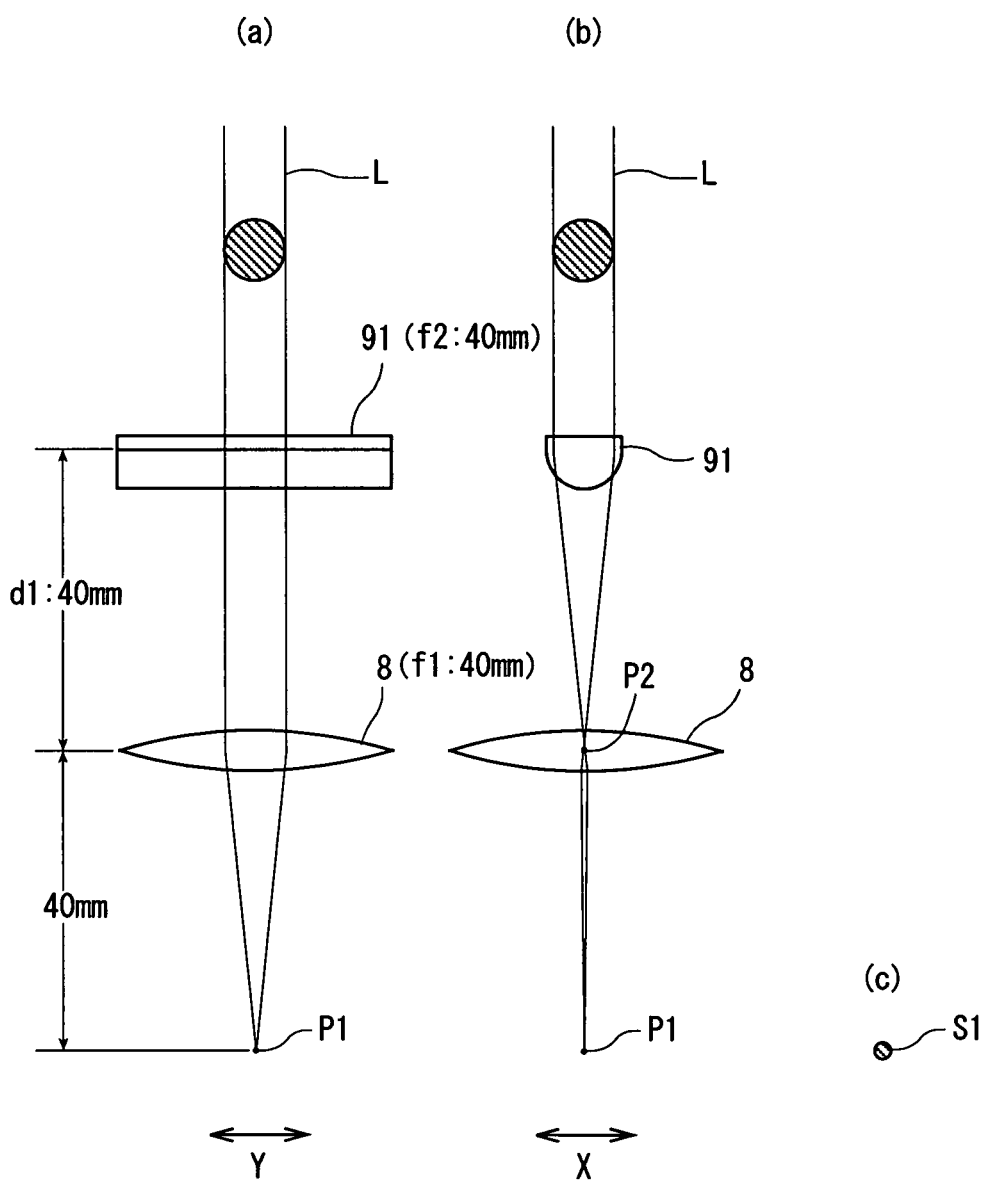
FIGS. 10(a), 10(b) and 10(c) are diagrams showing that a focal spot having a circular section is formed by the condenser lens and the cylindrical lens which is a convex lens.

A description is first given of a case where the interval (d1) between the cylindrical lens 91 and the condenser lens 8 is set to 40 mm which is the same as the focal distance (f2) of the cylindrical lens 91 as shown in FIGS. 10(a) and 10(b). In this case, a laser beam L is converged in the Y direction not by the cylindrical lens 91 but only by the condenser lens 8. That is, as shown in FIG. 10(a), the laser beam L passing through the cylindrical lens 91 is focused at a focal point P1 40 mm below the condenser lens 8 which is the focal distance (f1) of the condenser lens 8.

Meanwhile, the laser beam L is converged in the X direction by the cylindrical lens 91. That is, since the focal distance (f2) of the cylindrical lens 91 is set to 40 mm, the focal point P2 of the laser beam L focused in the X direction by the cylindrical lens 91 is existent at the center position of the condenser lens 8 as shown in FIG. 10(b). The laser beam L focused at the center position of the condenser lens 8 diverges toward the under surface of the condenser lens 8 and is focused again at the above focal point P1 from the under surface of the condenser lens 8. When the interval (d1) between the cylindrical lens 91 and the condenser lens 8 is made the same as the focal distance (f2) of the cylindrical lens 91, the laser beam L having a circular section input into the cylindrical lens 91 is converged by the cylindrical lens 91 in the X direction and by the condenser lens 8 in the Y direction, whereby a focal spot S1 having a circular section shown in the enlarged view of FIG. 10(c) is formed at the focal point P1. Therefore, when the workpiece is placed at the position of the focal point P1, it can be processed by means of the focal spot S1 having a circular section.

Figure 11:
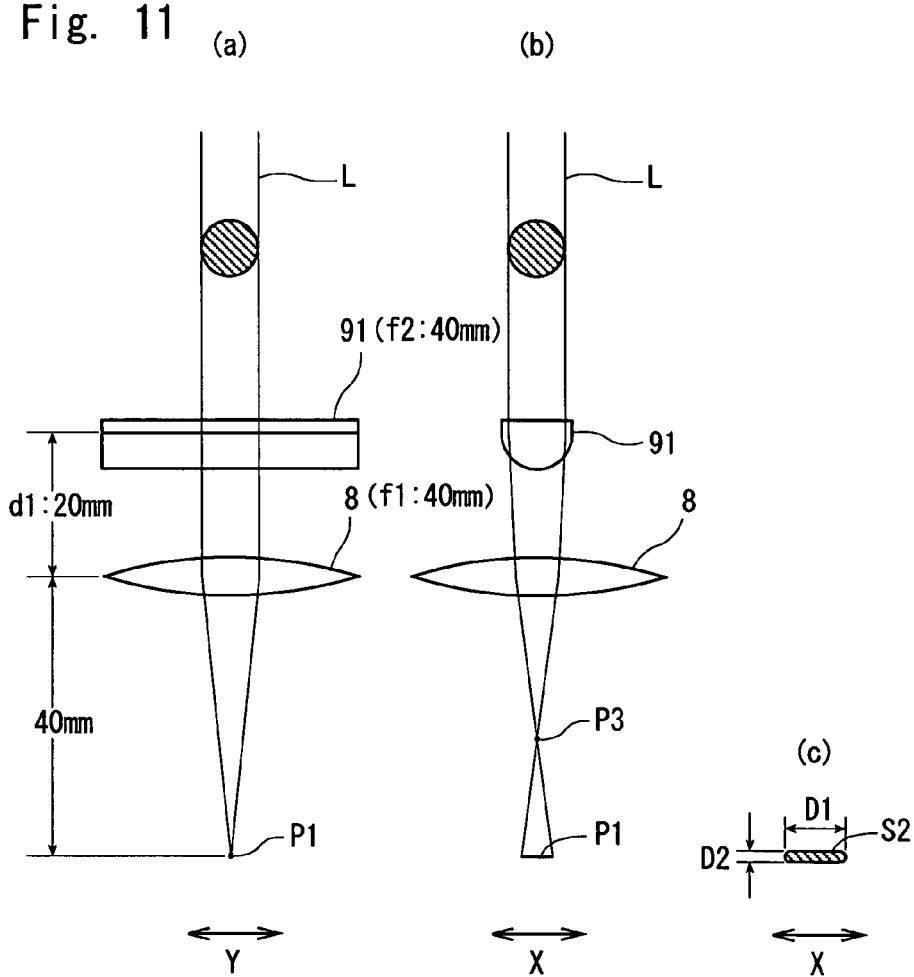
FIGS. 11(a), 11(b) and 11(c) are diagrams showing that a focal spot having an elliptic section is formed by the condenser lens and the cylindrical lens which is a convex lens.

A description is subsequently given of a case where the interval (d1) between the cylindrical lens 91 and the condenser lens 8 is set to 20 mm which is half of the focal distance (f2) of the cylindrical lens 91 as shown in FIGS. 11(a) and 11(b). Also in this case, the laser beam L is converged in the Y direction not by the cylindrical lens 91 but only by the condenser lens 8. That is, as shown in FIG. 11(a), the laser beam L passing through the cylindrical lens 91 is focused at the focal point P1 40 mm below the condenser lens 8 which is the focal distance (f1) of the condenser lens 8.

Meanwhile, since the focal distance (f2) of the cylindrical lens 91 is set to 40 mm, the laser beam L which is converged in the X direction by the cylindrical lens 91 as shown in FIG. 11(b) is input into the condenser lens 8 before it is focused, further converged by the condenser lens 8 to be focused at a focal point P3 and then diverged in the X direction until it reaches the workpiece. As a result, at the position of the focal point P1, a focal spot S2 having an elliptic section is formed as shown in the enlarged view of FIG. 11(c). The long axis D1 of the focal spot S2 having an elliptic section is formed in the direction shown by the arrow X. The ratio (aspect ratio) of the long axis D1 to the short axis D2 of the elliptic focal spot S2 can be controlled by changing the interval (d1) between the condenser lens 8 and the cylindrical lens 91. That is, as the interval (d1) between the condenser lens 8 and the cylindrical lens 91 becomes smaller than the focal distance (f2) of the cylindrical lens 91, the ratio (aspect ratio) of the long axis (D1) to the short axis (D2) of the elliptic focal spot S2 becomes larger. Therefore, when the workpiece is placed at the position of the focal point P1, it can be processed by means of the focal spot S2 having an elliptic section.

A description is subsequently given of a processing method for forming a groove in the workpiece by means of the focal spot S2 having an elliptic section shown in FIG. 11(c).

Figure 12:
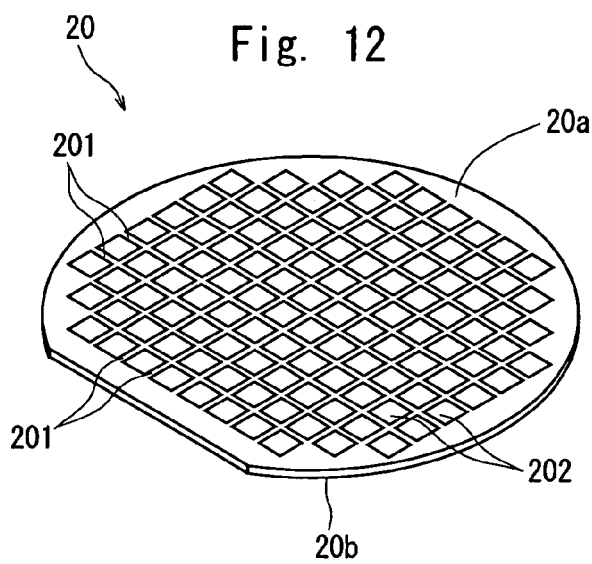
FIG. 12 is a perspective view of a semiconductor wafer as a wafer.

A semiconductor wafer as the workpiece to be processed by the above laser beam machine 1 will be described with reference to FIG. 12. The semiconductor wafer 20 shown in FIG. 12 is, for example, a silicon wafer having a thickness of 50 μm, a plurality of areas are defined by a plurality of streets 201 formed in a lattice on the front surface 20a, and a device 202 such as IC or LSI is formed in each of the defined areas.

Figure 13:
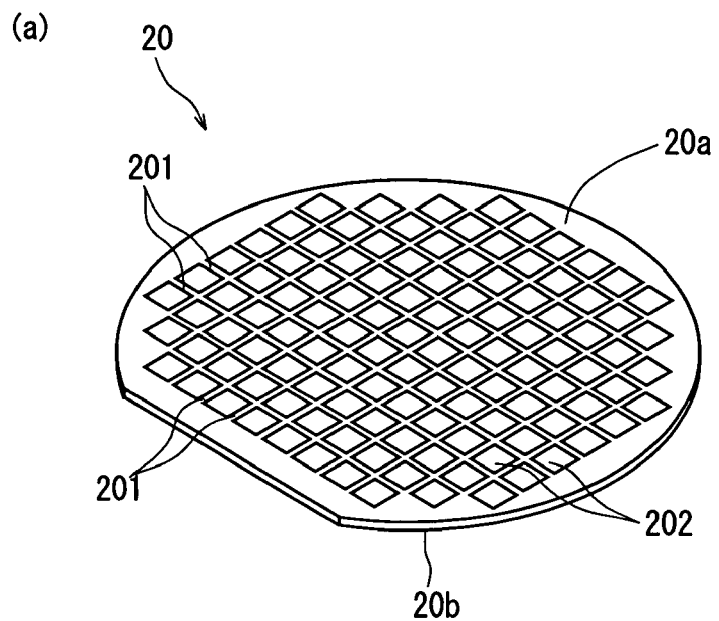
FIGS. 13(a) and 13(b) are diagrams showing the step of bonding an adhesive film to the rear surface of the semiconductor wafer shown in FIG. 12.
Figure 13:
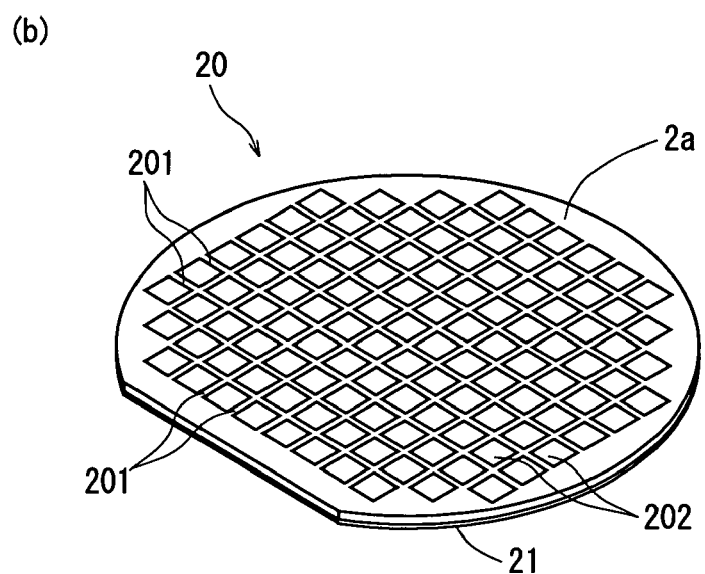

An adhesive film 21 for die bonding is bonded to the rear surface 20b of the above-described semiconductor wafer 20 as shown in FIGS. 13(a) and 13(b) (adhesive film bonding step). At this point, the adhesive film 21 is pressed against the rear surface 20b of the semiconductor wafer 20 under heating at 80 to 200° C. to be bonded to the rear surface 20b. The adhesive film 21 is made of a film material composed of a mixture of an epoxy resin and an acrylic resin and has a thickness of about 40 μm in the illustrated embodiment. The FH940 adhesive film of Hitachi Chemical Co., Ltd. may be used as the adhesive film.

Figure 14:
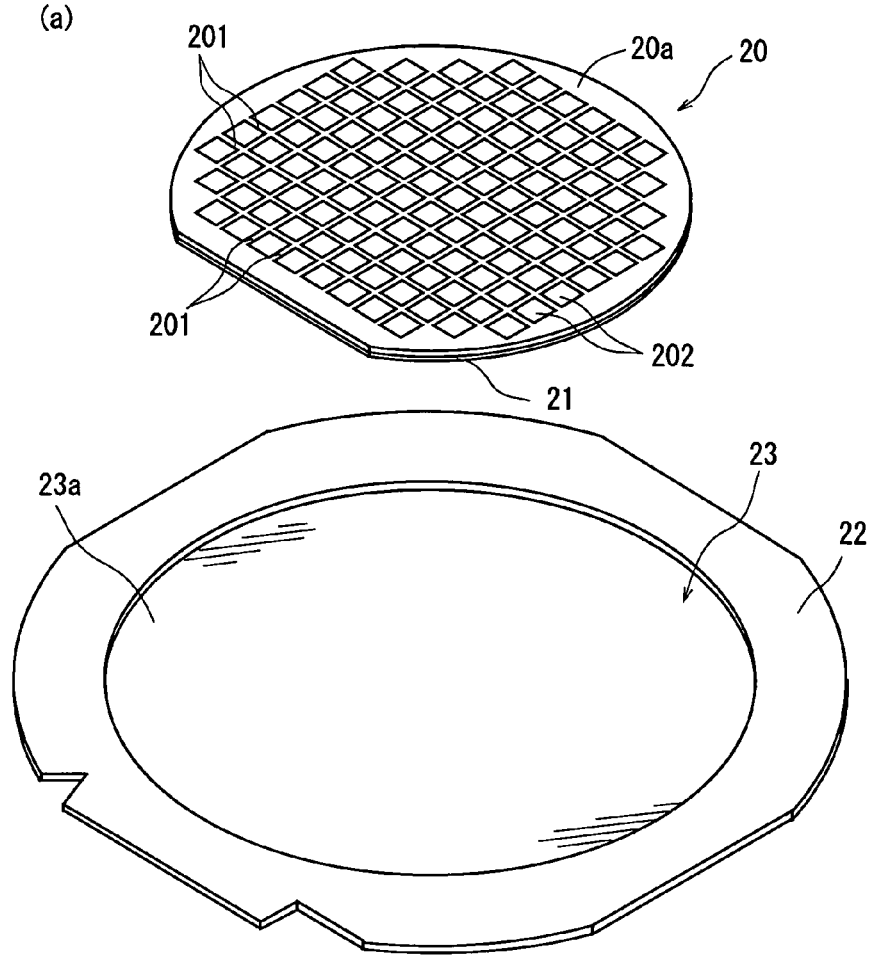
FIGS. 14(a) and 14(b) are diagrams showing the wafer supporting step for bonding the semiconductor wafer having the adhesive film on the rear surface to the front surface of a dicing tape affixed to an annular frame.
Figure 14:
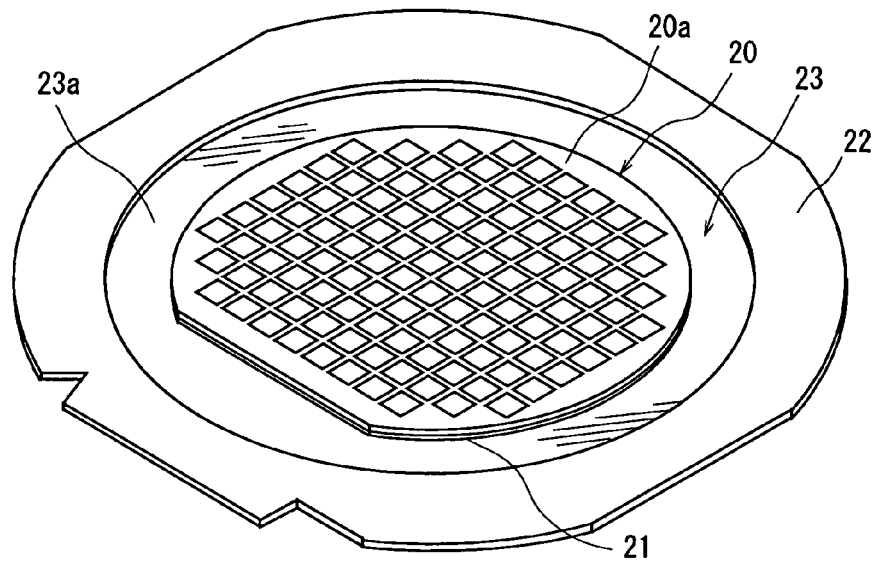

After the adhesive film bonding step, as shown in FIGS. 14(a) and 14(b), the adhesive film 21 side of the semiconductor wafer 20 is put on the front surface 23a of a dicing tape 23 whose peripheral portion is affixed to an annular frame 22 to cover its inner opening (wafer supporting step). The above dicing tape 23 has an about 5 μm-thick acrylic resin-based adhesive coating layer on the surface of a 70 μm-thick sheet substrate made of polyvinyl chloride (PVC) in the illustrated embodiment.

Other examples of the adhesive film bonding step and the wafer supporting step will be described with reference to FIGS. 15(a) and 15(b).

Figure 15:
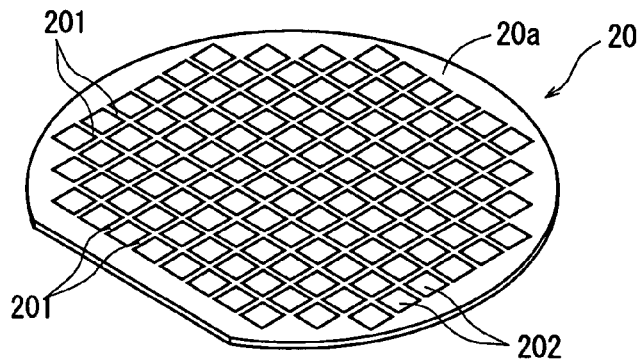
FIGS. 15(a) and 15(b) are diagrams showing the wafer supporting step for bonding the semiconductor wafer having the adhesive film on the rear surface to the front surface of a dicing tape affixed to an annular frame.
Figure 15:
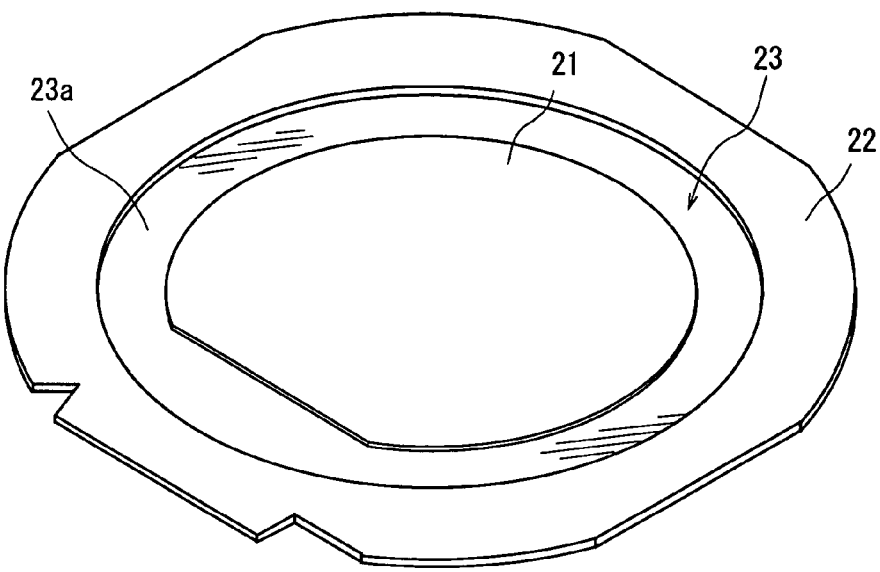
Figure 15:
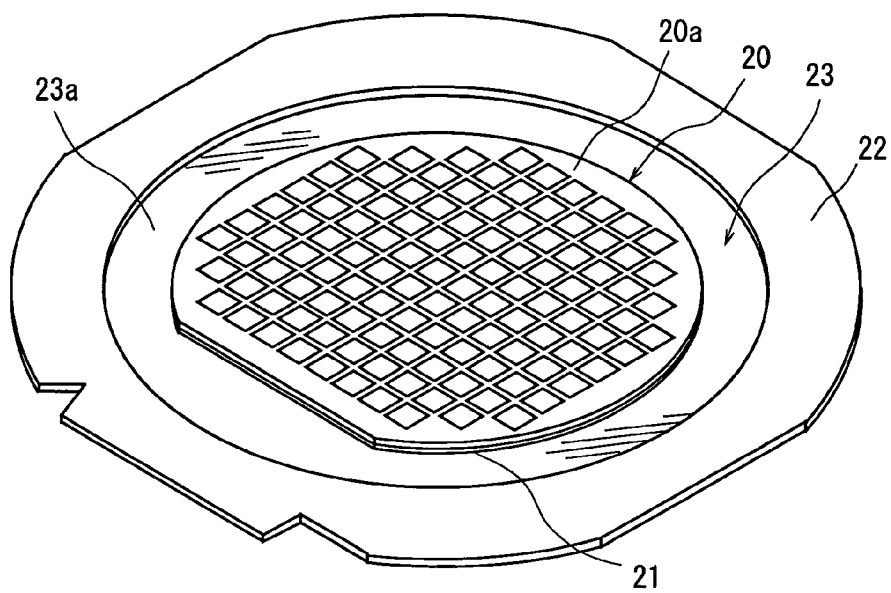

In the embodiment shown in FIGS. 15(a) and 15(b), a dicing tape having an adhesive film on the front surface is used. That is, as shown in FIGS. 15(a) and 15(b), the rear surface 20b of the semiconductor wafer 20 is put on the adhesive film 21 bonded to the front surface 23a of the dicing tape 23 whose peripheral portion is affixed to the annular frame 22 to cover its inner opening. At this point, the adhesive film 21 is pressed against the rear surface 20b of the semiconductor wafer 20 under heating at 80 to 200° C. to be bonded to the rear surface 20b. The LE5000 dicing tape having an adhesive film of Lintec Co., Ltd. may be used as the dicing tape having an adhesive film.

To divide the semiconductor wafer 20 and the adhesive film 21 bonded to the dicing tape 23 along the streets 201 by using the laser beam machine 1 shown in FIG. 1, the semiconductor wafer 20 is first placed on the chuck table 36 of the laser beam machine 1 in such a manner that the front surface 20a faces up. The semiconductor wafer 20 is suction held on the chuck table 36 through the dicing tape 23 by activating unshown suction means. The annular frame 22 mounting the dicing tape 23 is fixed by the clamps 362 provided on the chuck table 36. The chuck table 36 suction holding the semiconductor wafer 20 is positioned right below the image pick-up means 17 by the feed means 37. After the chuck table 36 is positioned right below the image pick-up means 17, alignment work for detecting the area to be processed of the semiconductor wafer 20 is carried out by the image pick-up means 17 and the control means 100. That is, the image pick-up means 17 and the control means 100 carry out image processing such as pattern matching to align a street 201 formed in a predetermined direction of the semiconductor wafer 20 with the condenser 7 of the laser beam application means 52 for applying a laser beam along the street 201, thereby performing the alignment of a laser beam application position. The alignment of the laser beam application position is also carried out on streets 201 formed on the semiconductor wafer 20 in a direction perpendicular to the above predetermined direction.

After the alignment of the laser beam application position is carried out by detecting the street 201 formed on the semiconductor wafer 20 held on the chuck table 36 as described above, as shown in FIG. 16(a), the chuck table 36 is moved to a laser beam application area where the condenser 7 of the laser beam application means 52 is located so as to position one end (left end in FIG. 16(a)) of the predetermined street 201 right below the condenser 7. The long axis D1 shown in FIG. 11(c) of the focal spot S2 having an elliptic section of the laser beam applied from the condenser 7 is aligned with the street 201.

Figure 16:
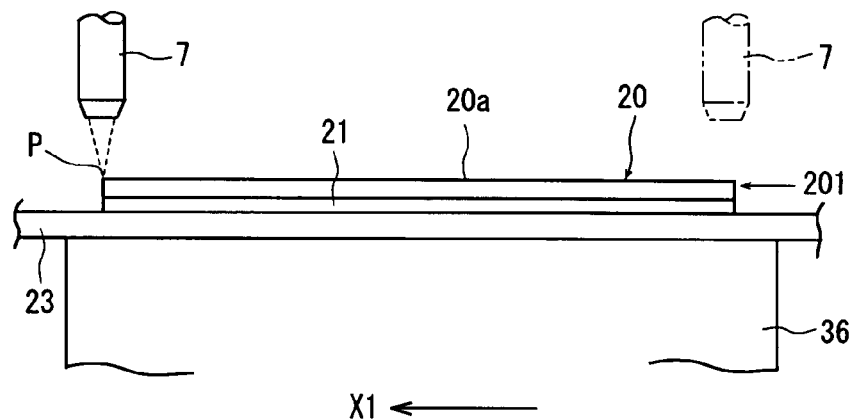
FIGS. 16(a), 16(b) and 16(c) are diagrams showing the wafer dividing step in the wafer dividing method of the present invention which is carried out by the laser beam machine shown in FIG. 1.
Figure 16:
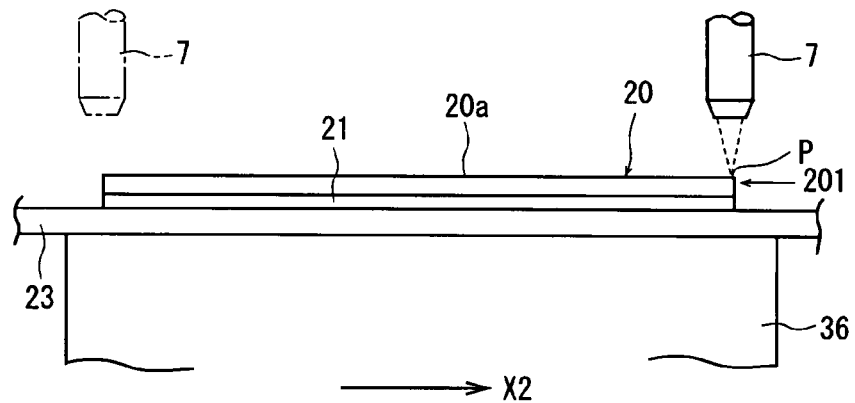
Figure 16:
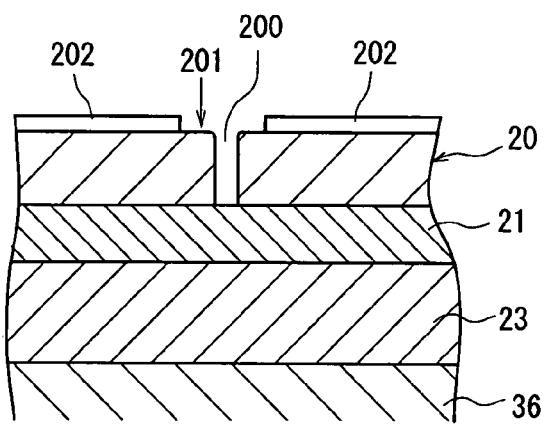

Next comes a wafer dividing step for forming a groove along the streets 201 by applying a first laser beam whose elliptic focal spot has a ratio (aspect ratio) of the long axis to the short axis of 15 to 20:1 along the streets formed on the wafer. In this wafer dividing step, according to experiments conducted by the inventors of the present invention, it is important that the ratio (aspect ratio) of the long axis to the short axis of the elliptic focal spot of the first laser beam should be set to 15 to 20:1 which is suitable for the formation of a groove in the wafer. As for the control of the aspect ratio of the elliptic focal spot, the pulse motor 162 of the above interval control mechanism 10 is controlled to achieve the aspect ratio set by the control means 100. The focal point P1 of the pulse laser beam applied from the condenser 7 is set to a position near the front surface 20a (top surface) of the semiconductor wafer 20. The moving means 53 for moving the laser beam application means 52 along the guide rails 423 and 423 in the direction shown by the arrow Z is used to set the focal point P1 to the position near the front surface 20a (top surface) of the semiconductor wafer 20. The chuck table 36 is then moved in the direction shown by the arrow X1 in FIG. 16(a) at a predetermined feed rate while a pulse laser beam of a wavelength (200 to 600 nm) having absorptivity for the semiconductor wafer 20 is applied from the condenser 7 of the laser beam application means 52. When the other end (right end in FIG. 16(a)) of the street 201 reaches a position right below the condenser 7, the application of the pulse laser beam is suspended, and the movement of the chuck table 36 is stopped. Thereafter, the chuck table 36 is moved in the direction shown by the arrow X2 in FIG. 16(b) at a predetermined feed rate while a pulse laser beam is applied from the condenser 7 of the laser beam application means 52 as shown in FIG. 16(b). When the other end (left end in FIG. 16(b)) of the street 201 reaches a position right below the condenser 7, the application of the pulse laser beam is suspended, and the movement of the chuck table 36 is stopped. A groove 200 reaching the rear surface 20b is formed along the street 201 in the semiconductor wafer 20 having a thickness of 50 μm as shown in FIG. 16(c) by repeating this wafer dividing step a plurality of times (for example, 3 round-trips). As a result, the semiconductor wafer 20 is divided along the street 201.

The above wafer dividing step is carried out under the following processing conditions, for example.
Light source of laser beam: YVO4 laser or YAG laser
Wavelength: 355 nm
Cyclic frequency: 10 kHz
Average output: 7 W
Focal spot: elliptic, long axis (D1) of 200 μm, short axis (D2) of 10 μm
Feed rate: 300 mm/sec Since the long axis (D1) of the elliptic focal spot of the first laser beam is set to 200 μm and the short axis (D2) is set to 10 μm to achieve an aspect ratio of 20:1 in the above wafer dividing step, the aspect ratio of the first laser beam is smaller than the aspect ratio of a second laser beam for dividing the adhesive film 21 which will be described hereinafter and the power density of the laser beam is high, thereby making it possible to divide the semiconductor wafer 20 which is a silicon wafer without fail.

Figure 17:
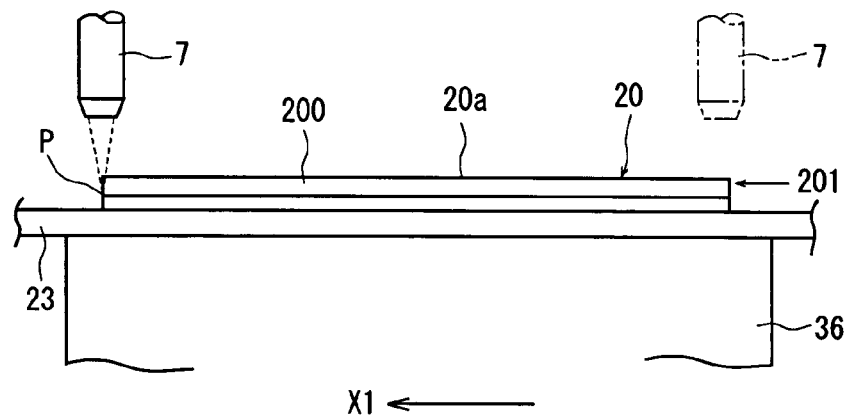
FIGS. 17(a), 17(b) and 17(c) are diagrams showing the adhesive film dividing step in the wafer dividing method of the present invention which is carried out by the laser beam machine shown in FIG. 1.
Figure 17:
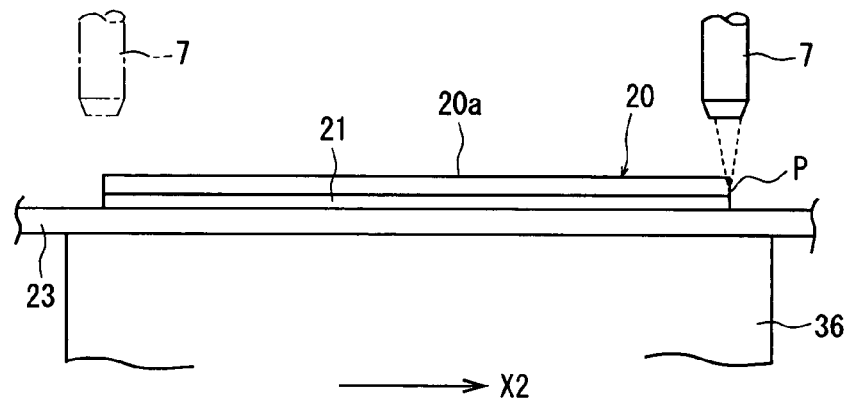
Figure 17:
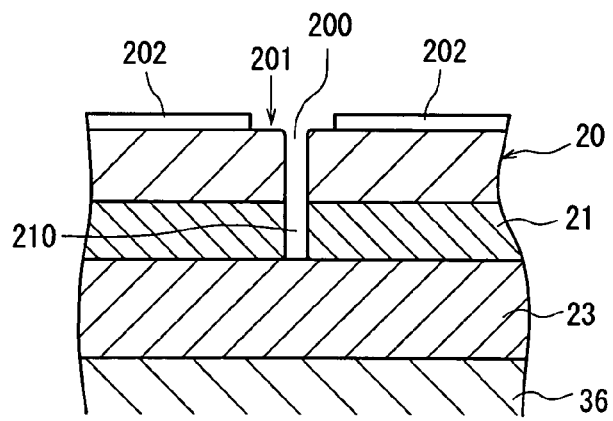

After the above wafer dividing step, next comes the step of dividing the adhesive film 21 along the grooves 200 by applying the second laser beam whose elliptic focal spot has a ratio of the long axis to the short axis of 60 to 70:1 to the adhesive film 21 through the grooves 200 formed by the wafer dividing step. In this adhesive film dividing step, according to experiments conducted by the inventors of the present invention, it is important that the ratio (aspect ratio) of the long axis to the short axis of the elliptic focal spot of the second laser beam should be set to 60 to 70:1 which is suitable for the division of the adhesive film. As for the control of the aspect ratio of the elliptic focal spot, the pulse motor 162 of the above interval control mechanism 10 is controlled to achieve the aspect ratio set by the control means 100. One end (left end in FIG. 17(a)) of the groove 200 (street 201) is positioned right below the condenser 7 as shown in FIG. 17(a). The long axis of the focal spot having an elliptic section of the laser beam applied from the condenser 7 is aligned with the groove 200 (street 201). The focal point P1 of the pulse laser beam applied from the condenser 7 is set to a position near the top surface of the adhesive film 21. The moving means 53 for moving the laser beam application means 52 along the guide rails 423 and 423 in the direction shown by the arrow Z is used to set the focal point P1 to the position near the top surface of the adhesive film 21.

The chuck table 36 is then moved in the direction shown by the arrow X1 in FIG. 17(a) at a predetermined feed rate while a pulse laser beam is applied from the condenser 7 of the laser beam application means 52. When the other end (right end in FIG. 17(a)) of the groove 200 (street 201) reaches a position right below the condenser 7, the application of the pulse laser beam is suspended, and the movement of the chuck table 36 is stopped. Thereafter, the chuck table 36 is moved in the direction shown by the arrow X2 in FIG. 17(b) at a predetermined feed rate while a pulse laser beam is applied from the condenser 7 of the laser beam application means 52 as shown in FIG. 17(b). When the other end (left end in FIG. 17(b)) of the groove 200 (street 201) reaches a position right below the condenser 7, the application of the pulse laser beam is suspended, and the movement of the chuck table 36 is stopped. A groove 210 reaching the under surface is formed along the groove 200 (street 201) in the adhesive film 21 having a thickness of 40 μm as shown in FIG. 17(c) by repeating this adhesive film dividing step a plurality of times (for example, 2 round-trips) As a result, the adhesive film 21 is divided along the groove 200 (street 201).

The above adhesive film dividing step is carried out under the following processing conditions, for example.
Light source of laser beam: YVO4 laser or YAG laser
Wavelength: 355 nm
Cyclic frequency: 10 kHz
Average output: 5 W
Focal spot: elliptic, long axis (D1) of 650 μm, short axis (D2) of 10 μm
Feed rate: 150 mm/sec Since the aspect ratio of the long axis (D1) to the short axis (D2) of the elliptic focal spot of the second laser beam in the above adhesive film dividing step is set to 65:1 which is larger than the aspect ratio of the long axis (D1) to the short axis (D2) of the focal spot in the above wafer dividing step and the area of the focal spot becomes large, the power density of the laser beam becomes low, whereby the adhesive film 21 is not molten and does not adhere to the dicing tape 23.

What is claimed is:

1. A method of dividing a wafer along a plurality of streets by moving the wafer at a predetermined rate while a laser beam whose focal spot is elliptic is applied along the streets formed on the wafer, the wafer having a plurality of areas defined by the plurality of streets formed in a lattice on a front surface, devices formed in the defined areas and an adhesive film for die bonding on a rear surface of the wafer and put on a dicing tape affixed to an annular frame, the method comprising:

forming grooves reaching the rear surface of the wafer, from the front surface of the wafer along the streets in the wafer, by applying a first laser beam whose elliptic focal spot has a ratio of the long axis to the short axis of 15 to 20:1; and dividing the adhesive film along the grooves formed by the first laser beam by applying a second laser beam, whose elliptic focal spot has a ratio of the long axis to the short axis of 60 to 70:1, to the adhesive film through the grooves.

2. The wafer dividing method according to claim 1, wherein the long axis of the elliptic focal spot of the first laser beam is set to 200 μm and the short axis of the elliptic focal spot of the first laser beam is set to 10 μm whereas the long axis of the elliptic focal spot of the second laser beam is set to 650 μm and the short axis of the elliptic focal spot of the second laser beam is set to 10 μm.

3. The wafer dividing method according to claim 2, wherein the cyclic frequency of the first laser beam is set to 10 kHz, the average output is set to 7 W and the feed rate is set to 300 mm/sec during said forming a groove and the cyclic frequency of the second laser beam is set to 10 kHz, the average output is set to 5 W and the feed rate is set to 150 mm/sec during said dividing the adhesive film.

4. The wafer dividing method according to claim 1, comprising:
providing an adhesive film made of a film material composed of a mixture of an epoxy and an acrylic resin.

5. A method of dividing a wafer along a plurality of streets by moving the wafer at a predetermined rate while a laser beam whose focal spot is elliptic is applied along the streets formed on the wafer, the wafer having a plurality of areas defined by the plurality of streets formed in a lattice on the front surface of the wafer, devices formed in the defined areas and an adhesive film made of a film material composed of a mixture of an epoxy and an acrylic resin for die bonding on the rear surface of the wafer and put on a dicing tape affixed to an annular frame, the method comprising:

forming grooves along the streets in the wafer by applying a first laser beam whose first elliptic focal spot has a ratio of the long axis to the short axis of 15 to 20:1 along the streets formed on the wafer;

changing the first laser beam into a second laser beam having a second elliptic focal spot with a ratio of the long axis to the short axis of 60 to 70:1, wherein the second elliptic focal spot has a power density lower than the first elliptic focal spot and lower than a power density capable of melting the adhesive film; and dividing the adhesive film along the grooves by applying the second laser beam to the adhesive film through the grooves.

* * * * *